(12) United States Patent
Zhou et al.

(10) Patent No.: US 12,146,908 B1
(45) Date of Patent: Nov. 19, 2024

(54) IN-SITU TESTING SYSTEM FOR SEMICONDUCTOR DEVICE IN AEROSPACE IRRADIATION ENVIRONMENT

(71) Applicant: NANJING UNIVERSITY, Nanjing (CN)

(72) Inventors: Feng Zhou, Nanjing (CN); Wenfeng Wang, Nanjing (CN); Hai Lu, Nanjing (CN); Weizong Xu, Nanjing (CN); Dong Zhou, Nanjing (CN); Fangfang Ren, Nanjing (CN)

(73) Assignee: NANJING UNIVERSITY, Nanjing (CN)

( * ) Notice: Subject to any disclaimer, the term of this patent is extended or adjusted under 35 U.S.C. 154(b) by 0 days.

(21) Appl. No.: 18/631,171

(22) Filed: Apr. 10, 2024

(30) Foreign Application Priority Data

Oct. 23, 2023 (CN) .......................... 202311370126.3

(51) Int. Cl.
    G01R 31/28 (2006.01)
(52) U.S. Cl.
    CPC ..... G01R 31/2872 (2013.01); G01R 31/2858 (2013.01); G01R 31/2889 (2013.01)
(58) Field of Classification Search
    CPC ......... G01R 27/00; G01R 27/04; G01R 27/32
    See application file for complete search history.

(56) References Cited

U.S. PATENT DOCUMENTS

| 6,522,985 | B1 * | 2/2003 | Swoboda | ............ | G06F 11/3656 |
| | | | | | 702/108 |
| 6,675,332 | B1 * | 1/2004 | Suzuki | .................... | G06F 11/24 |
| | | | | | 714/E11.154 |
| 2011/0050269 | A1 | 3/2011 | Miyazono et al. | | |

FOREIGN PATENT DOCUMENTS

| CN | 108139443 A | 6/2018 |
| CN | 212410779 U | 1/2021 |
| CN | 214795101 U | 11/2021 |
| CN | 215910805 U | 2/2022 |
| CN | 114325301 A | 4/2022 |

(Continued)

OTHER PUBLICATIONS

CNIPA, Office Action issued for Chinese Application No. 202311370126.3 mailed Nov. 30, 2023.

(Continued)

*Primary Examiner* — Tung X Nguyen
(74) *Attorney, Agent, or Firm* — Daniel M. Cohn; Howard M. Cohn (57) ABSTRACT

The present invention discloses an in-situ testing system for semiconductor device in aerospace irradiation environment. The present invention includes a static testing unit, a static testing channel, a dynamic testing unit, a dynamic testing channel, and a channel switching control unit; the static testing unit is connected to the device under test through the static testing channel, and is used to output static testing signals and display the static testing data of the device under test; the dynamic testing unit is connected to the device under test through the dynamic testing channel, and is used to output dynamic testing signals and display the dynamic testing data of the device under test; the channel switching control unit is connected to the static testing channel and the dynamic testing channel, respectively. This invention can achieve static, dynamic, and degradation testing of third-generation semiconductor device in aerospace irradiation environment.

8 Claims, 5 Drawing Sheets

(56) References Cited

FOREIGN PATENT DOCUMENTS

| | | |
|---|---|---|
| CN | 114487768 A | 5/2022 |
| CN | 115598484 A | 1/2023 |
| CN | 116209904 A | 6/2023 |
| CN | 116593924 A | 8/2023 |
| JP | 2008157695 A | 7/2008 |

OTHER PUBLICATIONS

Notification to Grant Patent Right for Invention, Chinese Application No. 202311370126.3, mailed Jan. 2, 2024.

* cited by examiner

IN-SITU TESTING SYSTEM FOR SEMICONDUCTOR DEVICE IN AEROSPACE IRRADIATION ENVIRONMENT

CROSS-REFERENCE OF RELATED APPLICATIONS

This patent application claims the benefit and priority of Chinese Patent Application No. 202311370126.3 filed on Oct. 23, 2023, the disclosure of which is incorporated by reference herein in its entirety as part of the present application.

TECHNICAL FIELD

The present invention relates to the technical field of semiconductor performance testing, especially relates to an in-situ testing system for semiconductor device in aerospace irradiation environment.

BACKGROUND

The radiation effects in the aerospace irradiation environment refer to the phenomena that high-energy charged particles cause anomalies, malfunctions or failures of spacecraft devices, materials, etc., through ionization, atomic displacement, nuclear reactions or other kinds of action on matter.

The third-generation semiconductors represented by silicon carbide (SiC), gallium nitride (GaN), and aluminum nitride (AlN) are widely used in high-voltage, high-power and aerospace applications by reason of their wider bandgap, higher breakdown field, higher thermal conductivity, larger electron saturation velocity and better radiation resistance. The stability and reliability of semiconductor device are crucial, and knowing the performance of semiconductor device in various scenarios set in both civil and aerospace irradiation background, is key to the evaluation of the stability and reliability of third-generation semiconductor power devices. Accordingly, in order to accurately evaluate the stability, reliability and radiation-resistant property of semiconductor device in aerospace environments, it is necessary to consider how to test the performance of semiconductor device in all situations.

SUMMARY

The present invention addresses the technical problem of how to test the performance of third-generation semiconductor device in aerospace irradiation environment by providing an In-situ testing system for semiconductor device in aerospace irradiation environment.

The present invention provides the following technical solution:

A system for semiconductor device in-situ testing, the semiconductor device to be tested comprises a G terminal, a D terminal, and an S terminal, the system comprises: a static testing unit, a static testing channel, a dynamic testing unit, a dynamic testing channel, and a channel switching control unit;

the static testing unit is connected to the semiconductor device under test via the static testing channels, and is used to output static testing signals and display the static testing data of the semiconductor device under test;

the dynamic testing unit is connected to the semiconductor device under test via the dynamic testing channels, and is used to output dynamic testing signals and display the dynamic testing data of the semiconductor device under test;

the channel switching control unit is respectively connected with the static testing channel and the dynamic testing channel, and controls them; when the static testing channel is conducted, the dynamic testing channel is disconnected, and when the static testing channel is disconnected, the dynamic testing channel is conducted.

Optionally, the static testing channels include the first channel, the second channel, and the third channel;

the static testing unit is connected to the G terminal of the semiconductor device under test via the first channel, connected to the D terminal of the semiconductor device under test via the second channel, and the S terminal of the semiconductor device under test is grounded via the third channel;

the first channel, the second channel, and the third channel are respectively connected to the channel switching control unit, and are controlled by the channel switching control unit to conduct or disconnect simultaneously.

Optionally, the first channel, the second channel, and the third channel include transistors;

the channel switching control unit includes a signal generation module and an inverter circuit;

the signal generation module is connected to a control terminal of the transistor via the inverter circuit;

the signal generation module is used to output pulse signals of high level, low level, or square wave, and the inverter circuit inverts the pulse signals.

Optionally, the inverting circuit includes an inverter, and the signal generation module is connected to a control terminal of the transistor via the inverter.

Optionally, circuits of the first channel, the second channel, and the third channel are structurally identical.

Optionally, the dynamic testing unit includes a power supply, a trigger module, and an oscilloscope, and the dynamic testing channel includes a fourth channel, a fifth channel, and a sixth channel;

the trigger module is connected to the G terminal of the semiconductor device via the fourth channel, and is used to output a trigger signal; the power supply is connected to the D terminal of the semiconductor device via the fifth channel, and the S terminal of the semiconductor device under test is grounded via the sixth channel;

the G terminal, D terminal, and S terminal of the semiconductor device are also connected to the oscilloscope;

the fourth channel, the fifth channel, and the sixth channel are controlled by the channel switching control unit to conduct or disconnect simultaneously.

Optionally, the fourth channel, the fifth channel, and the sixth channel include components, the component consists of a series-connected photodiode and an operational amplifier;

the channel switching control unit also includes a laser emission circuit, and the signal generation module is connected to the laser emission circuit;

the laser emission circuit emits laser when receiving the pulse signal of high level and turns off when receiving the pulse signal of low level.

Optionally, the laser emission circuit comprises a laser driving circuit and a laser diode, and the signal generation module is connected to the laser diode via the laser driving circuit, the laser driving circuit drives the laser diode to emit light upon receiving a high level of electricity.

Optionally, circuits of the fourth channel, the fifth channel, and the sixth channel are structurally identical.

Optionally, the static testing unit is a source measurement unit.

The Beneficial Effects of the Invention:

When the channel switching control unit controls the static test channels to be always conductive and the dynamic test channels to be always off, the static test unit can output static test signals to the device under test through the static test channel, and display the static test data of the device under test, completing the static characteristic test of the device under test; When the channel switching control unit controls the dynamic test channels to be always conductive and the static test channels to be always off, the dynamic test unit can output dynamic test signals to the device under test through the dynamic test channels, and display the dynamic test data of the device under test, completing the dynamic characteristic test of the device under test; When the channel switching control unit controls the static test channels and the dynamic test channels to be conductive alternately, the static characteristic test of the device under test can be completed first, the dynamic characteristic test of the device under test comes second, thirdly the static characteristic test of the device under test can be completed again, and finally the degradation characteristic test of the device under test should be completed; thus the performance test of semiconductor device under test which are to be used in aerospace irradiation environments can be fulfilled.

BRIEF DESCRIPTION OF THE DRAWINGS

To provide a clearer explanation of the technical solutions in this embodiment of the present invention, a brief introduction to the drawings required for the description of the embodiment will be given below. It is obvious that the drawings in the following description are parts of embodiments of the present invention. For ordinary technicians in this area, without extra brain work, they can also obtain other drawings by following these.

DETAILED DESCRIPTION OF THE EMBODIMENTS

The present embodiment of this invention provides a semiconductor device in-situ testing system to be applied in aerospace irradiation environments; it is capable of solving the technical problem of testing the performance of third-generation semiconductor device in civil and aerospace irradiation scenarios.

In order to make the technical solutions of the present invention to be better understood, a detailed explanation of the technical solutions of the present invention will be provided in conjunction with the attached drawings and specific methods of embodiment.

Figure 1:
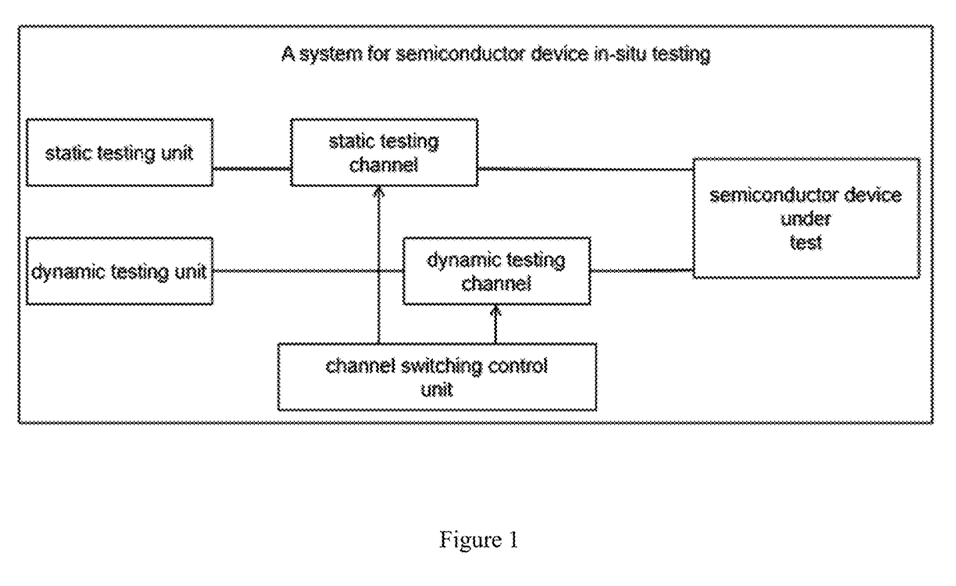
FIG. 1 is a schematic diagram of the structure of the system for semiconductor device in-situ testing in the present example of embodiment of the present invention.

As shown in FIG. 1, the semiconductor device in-situ testing system to be applied in aerospace irradiation environments in the present embodiment of the invention comprises a G terminal, a D terminal, and an S terminal, the system comprises: a static testing unit, a static testing channel, a dynamic testing unit, a dynamic testing channel, and a channel switching control unit; the static testing unit, connected to the semiconductor device via the static testing channel, is used to output static testing signals and display the static testing data of the semiconductor device; the dynamic testing unit, connected to the semiconductor device via the dynamic testing channel, is used to output dynamic testing signals and display the dynamic testing data of the semiconductor device; the channel switching control unit is respectively connected with the static testing channel and the dynamic testing channel, and controls them; when the static testing channel is conducted, the dynamic testing channel is disconnected, and when the static testing channel is disconnected, the dynamic testing channel is conducted.

In the present embodiment of the invention, when the channel switching control unit continuously controls the static test channels to be conductive and the dynamic test channels to be off, the static test unit can output static test signals to the device under test through the static test channels and display the static test data of the device under test, completing the static characteristic test of the device under test. When the channel switching control unit continuously controls the dynamic test channels to be conductive and the static test channels to be off, the dynamic test unit can output dynamic test signals to the device under test through the dynamic test channels and display the dynamic test data of the device under test, completing the dynamic characteristic test of the device under test. When the channel switching control unit rapidly alternates between conducting the static testing channels and the dynamic testing channels, the static characteristic test of the device under test can be completed first, then the dynamic characteristic test, and then another round of static characteristic test, and ultimately the degradation characteristic test of the device under test can be completed, thereby the overall performance test of the semiconductor device under test is finished.

Figure 2:
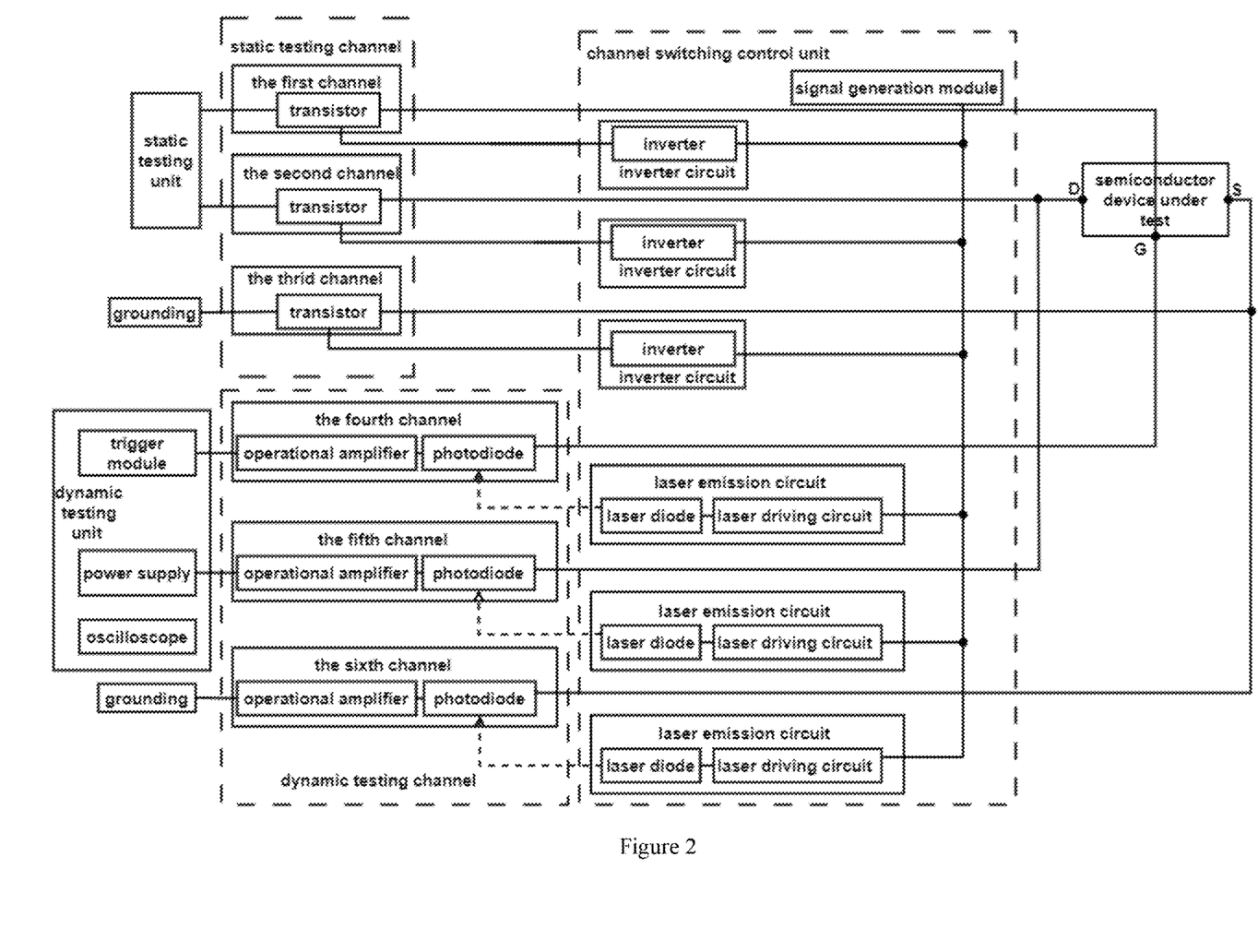
FIG. 2 is another schematic diagram of the structure of system for semiconductor device in-situ testing in the present example of embodiment of the present invention.

A Furthermore, as shown in FIG. 2, the static test channels include a first channel, a second channel, and a third channel; the static test unit is respectively connected to the G terminal of the device under test through the first channel and connected to the D terminal of the device under test through the second channel, and the S terminal of the device under test is grounded through the third channel; the first channel, the second channel, and the third channel are respectively connected to the channel switching control unit, and are controlled by the channel switching control unit to conduct or disconnect simultaneously; the dynamic test unit includes a power supply, a trigger module and an oscilloscope, and the dynamic test channels include a fourth channel, a fifth channel, and a sixth channel; the trigger module is connected to the G terminal of the device under test through the fourth channel and is used to output trigger signals; the power supply is connected to the D terminal of the device under test through the fifth channel and the S terminal of the device under test is grounded through the sixth channel; the G, D, and S terminals of the device under test are also connected to the oscilloscope; the fourth channel, the fifth channel, and the sixth channel are controlled by the channel switching control unit to conduct or disconnect simultaneously.

Furthermore, the power supply can be a programmable high-voltage AC power supply; the oscilloscope is used to display the dynamic characteristic curve of the device under test; the trigger signal can be an editable pulse signal. When the channel switching control unit controls the first channel, the second channel and the third channel to be conductive and the fourth channel, the fifth channel and the sixth channel to be disconnected, the static test unit outputs static test signals; Thus the static characteristic test of the device under test is achieved; when the channel switching control unit controls the first channel, the second channel, and the third channel to be disconnected and the fourth channel, the fifth channel and the sixth channel to be conductive, the trigger module outputs trigger signals to the G terminal of the device under test through the fourth channel, and the power supply outputs high-voltage stress to the D terminal of the device under test through the fifth channel, i.e., the dynamic test signals include trigger signals and high-voltage power supply signals, thus can the dynamic characteristic test of the device under test be achieved.

Furthermore, the first channel, the second channel or the third channel can include transistors, and the fourth channel, the fifth channel or the sixth channel can include a series-connected photodiode and operational amplifier; the channel switching control unit can include a signal generation module, an inverting circuit, and a laser transmitting circuit. The signal generation module is connected to the control terminal of the transistor through the inverting circuit; the signal generation module is used to output high level, low level or square wave pulse signals, and the inverting circuit is used to invert the signals output by the signal generation module. The laser transmitting circuit is used to transmit laser upon reception of a high level and turn off the laser transmission upon reception of a low level, and the laser switch circuit becomes conductive upon receiving the laser and disconnected when not receiving the laser. Moreover, the laser transmission circuit can further include a laser drive circuit and a laser diode, and the signal generation module is connected to the laser diode through the laser drive circuit, and the laser drive circuit is used to drive the laser diode to transmit laser light upon receiving a high level.

Certainly, the circuit structures of the first, second, and third channels can be the same or different, and the circuit structure of the fourth, fifth, and sixth channels can also be the same or different. In the present embodiment of the invention, the circuit structures of the first, second, and third channels are the same, and the circuit structures of the fourth, fifth, and sixth channels are the same. Therefore, each of the first, second, and third channels includes a transistor, and each of the fourth, fifth, and sixth channels includes a photodiode. The channel switching control unit includes three inverting circuits and three laser transmission circuits, with each inverting circuit corresponding to a transistor and each laser transmitting circuit corresponding to a photodiode.

When the signal generation module outputs a low level, the three inverting circuits output a high level, causing the first, second, and third channels to be turned conductive; The three laser drive circuits receive the low level; as a result, the three laser diodes do not transmit light; and the three photodiodes are put off, thus closing the fourth, fifth and sixth channels. When the signal generation module outputs a high level, the three inverting circuits output a low level, resulting in the first, second and third channels being closed; The three laser drive circuits receive the high level; on cue, the three laser diodes transmit laser light, and the three photodiodes become conductive, thus the fourth, fifth, and sixth channels are opened. When the signal generation module outputs a square wave pulse signal, if the pulse signal is at a low level, the first, second and third channels become conductive while the fourth, fifth and sixth channels are closed. If the pulse signal is at a high level, the first, second and third channels are closed while the fourth, fifth, and sixth channels become conductive.

Figure 3:
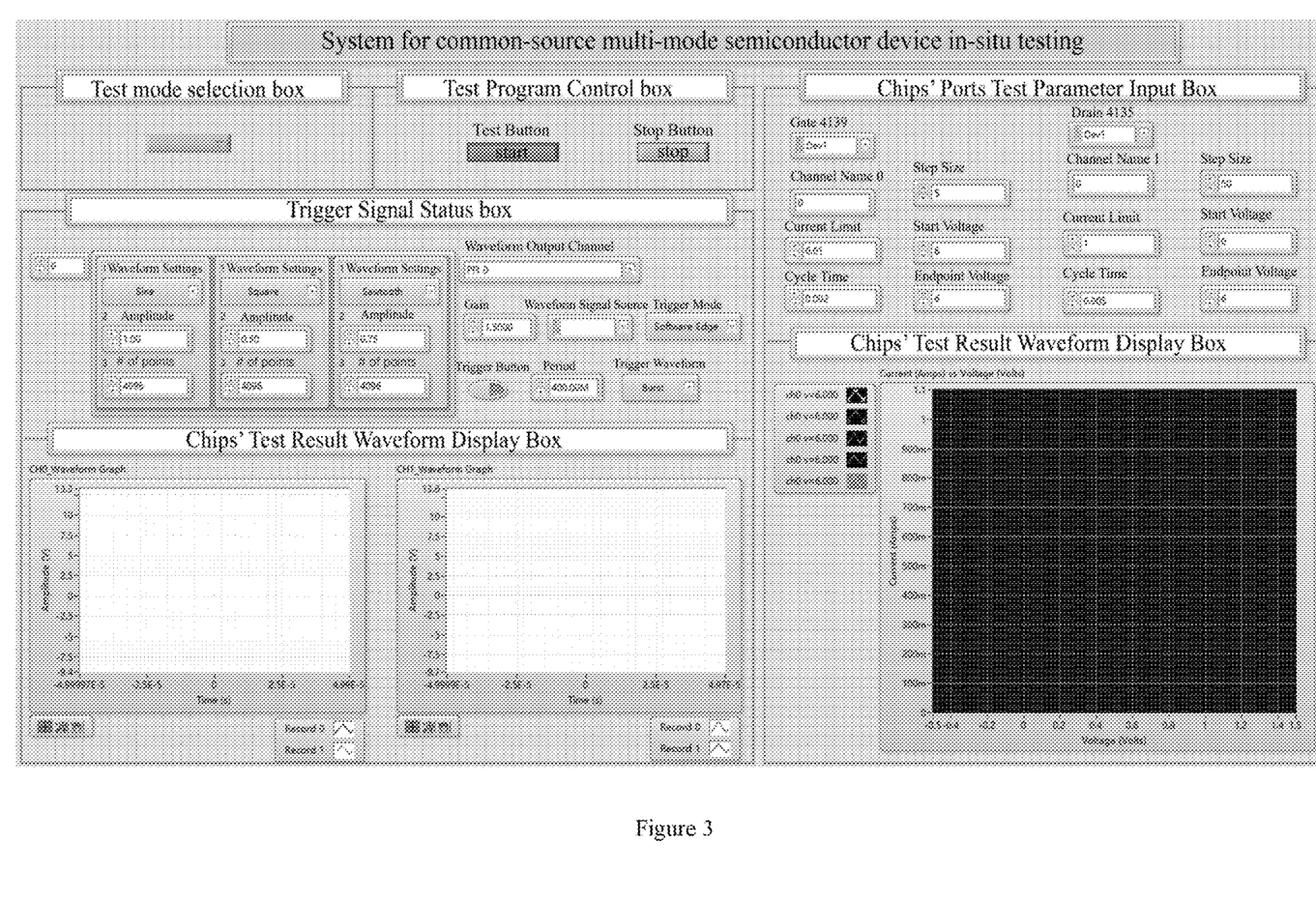
FIG. 3 is a schematic diagram of the UI control interface in the present example of embodiment of the present invention.

Furthermore, as shown in FIG. 3, the semiconductor device in-situ testing system to be applied in aerospace irradiation environments in the present embodiment of the invention may also include a UI control interface. The UI control interface is used to select the test mode, test parameters, trigger signals, control the start and stop of the test, receive test data and display the test data in real time. The test modes include static characteristic test mode, dynamic characteristic test mode and degradation characteristic test mode. The test parameters include the input start voltage, end voltage, current limit, and test voltage step size for each port of the semiconductor device. The trigger signals include waveform output channels, trigger modes, trigger waveform amplitudes, periods, gain peaks and widths. The UI control interface is connected to the static test unit, trigger module and signal generation module.

Figure 4:
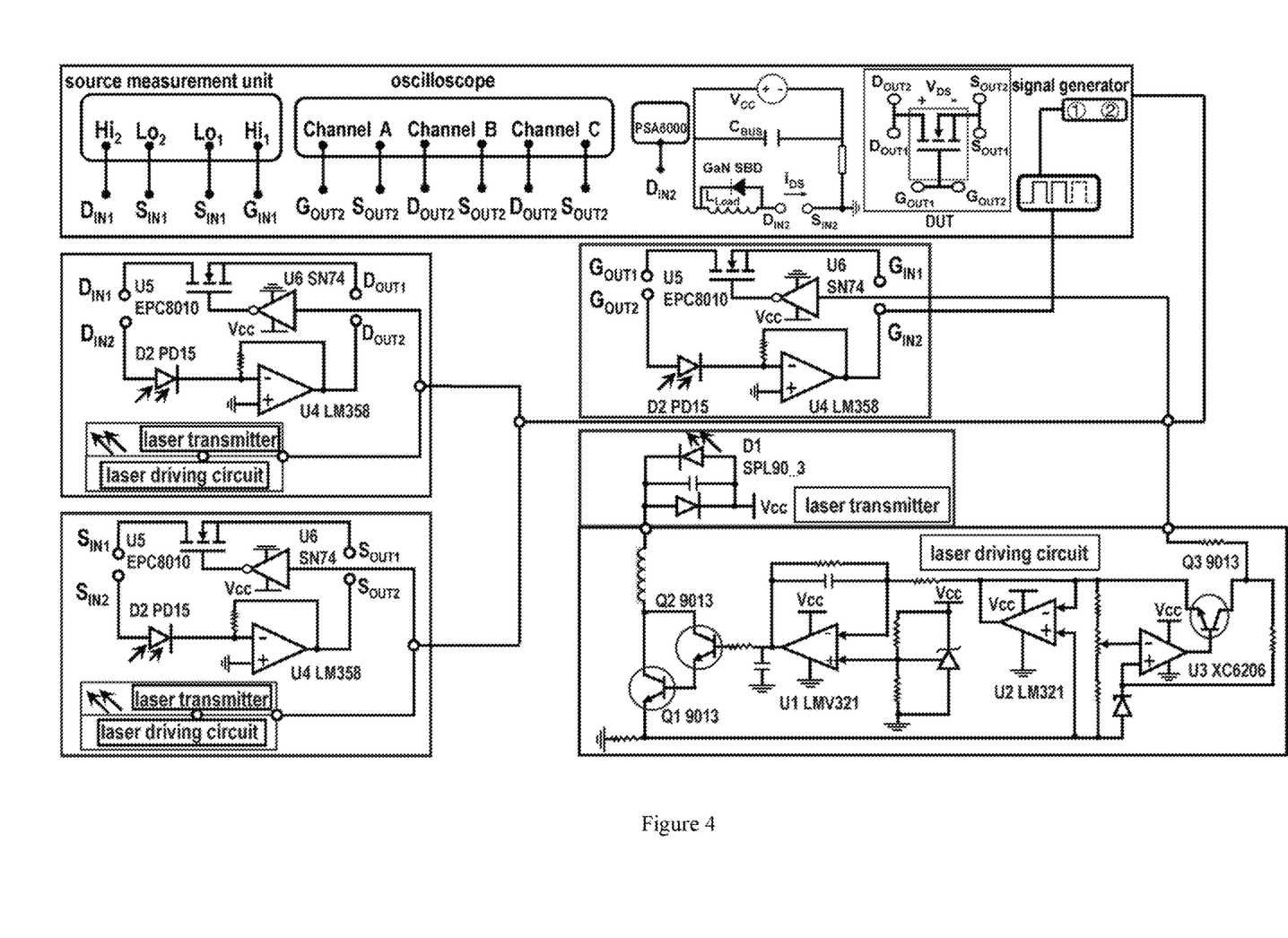
FIG. 4 is a circuit diagram of system for semiconductor device in-situ testing in the present example of embodiment of the present invention.

As shown in FIG. 4, the DUT is the semiconductor device under test, Gin1-Gout1 represents the first channel, Din1-Dout1 represents the second channel, Sin1-Sout1 represents the third channel, U5-EPC8010 is a transistor, U6-SN74 is an inverter, and each inverting circuit includes one inverter. The signal generation module is connected to the control terminal of the corresponding transistor via the inverter. The trigger module and the signal generation module can both be part of a signal generator. The trigger module outputs trigger signals through channel 1 of the signal generator, and the signal generation module outputs high level, low level, or square wave pulse signals through channel 2 of the signal generator. The square wave pulse signal can have an amplitude of 5V, falling and rising edges of 5 ns and an adjustable pulse width. PSA6000 is the power supply, Gin2-Gout2 represents the fourth channel, Din2-Dout2 represents the fifth channel, Sin2-Sout2 represents the sixth channel, D2-PD15 is a photodiode, U4-LM358 is an operational amplifier, and D1-SPL90_3 is a laser diode.

When performing static characteristic testing on the semiconductor device under test (DUT), the signal generator's channel 2 outputs a low level, the three inverting circuits output a high level, causing the first, second, and third channels to be turned conductive; The three laser drive circuits receive the low level, then the three laser diodes do not transmit light; and the three photodiodes are put off, thus closing the fourth, fifth and sixth channels. In the UI control interface shown in FIG. 3, the static characteristic test mode is selected, the static testing signals are selected: (1) When testing the output characteristics of the DUT, the Vg signals are compiled through the Hi1 channel of the source measurement unit and the first channel, and sent to the G terminal of the DUT; the Lo1 channel is connected to the Sin1 node and grounded, and the S terminal of the DUT is grounded through the third channel; The UI control interface customizes the test parameters and transmits them to the D terminal of the DUT through the Hi2 channel and the second channel. The Lo2 channel is connected to the Sin1 node, and captures, together with Hi2 Channel, the output signal after the output characteristic test is completed; and, the curve is output and displayed in the test result waveform display box.

(2) When testing the transfer characteristics of the DUT, the Vd signals are compiled through the Hi2 channel of the source measurement unit and the second channel, and sent to the D terminal of the DUT; the Lo2 channel is connected to the Sin1 node and grounded, and the S terminal of the DUT is grounded through the third channel; The UI control interface customizes the test parameters and transmits them to the G terminal of the DUT through the Hi1 channel and the first channel; The Lo1 channel is connected to the Sin1 node and captures, together with the Hi1 channel, the output signal after the transfer characteristic test is completed; and, the curve is output and displayed in the test result waveform display box.

When performing dynamic characteristic testing on the DUT, the signal generator's channel 2 outputs a high level signal, causes the three inverting circuits to output a low level, resulting in the first, second and third channels being closed; The three laser drive circuits receive the high level; on cue, the three laser diodes transmit laser light, and the three photodiodes become conductive, thus the fourth, fifth, and sixth channels are opened. In the UI control interface shown in FIG. 3, the dynamic characteristic test mode is selected, and the trigger signal is customized; The trigger signal is transmitted to the G terminal of the DUT through channel 1 of the signal generator and the fourth channel, while the high voltage stress is input to the D terminal of the DUT through the fifth channel by the PSA6000; The S terminal of the DUT is grounded through the sixth channel. The Channel_A of the oscilloscope is connected to the G and S terminals of the DUT, Channel_B is connected to the D and S terminals of the DUT, and Channel_C is connected to the D and S terminals of the DUT; these channels are to capture the Vgs, Ids and Vds signal curves of the DUT and to feedback the dynamic characteristic curves to the test result waveform display box of the DUT, thus completing the dynamic test.

Figure 5:
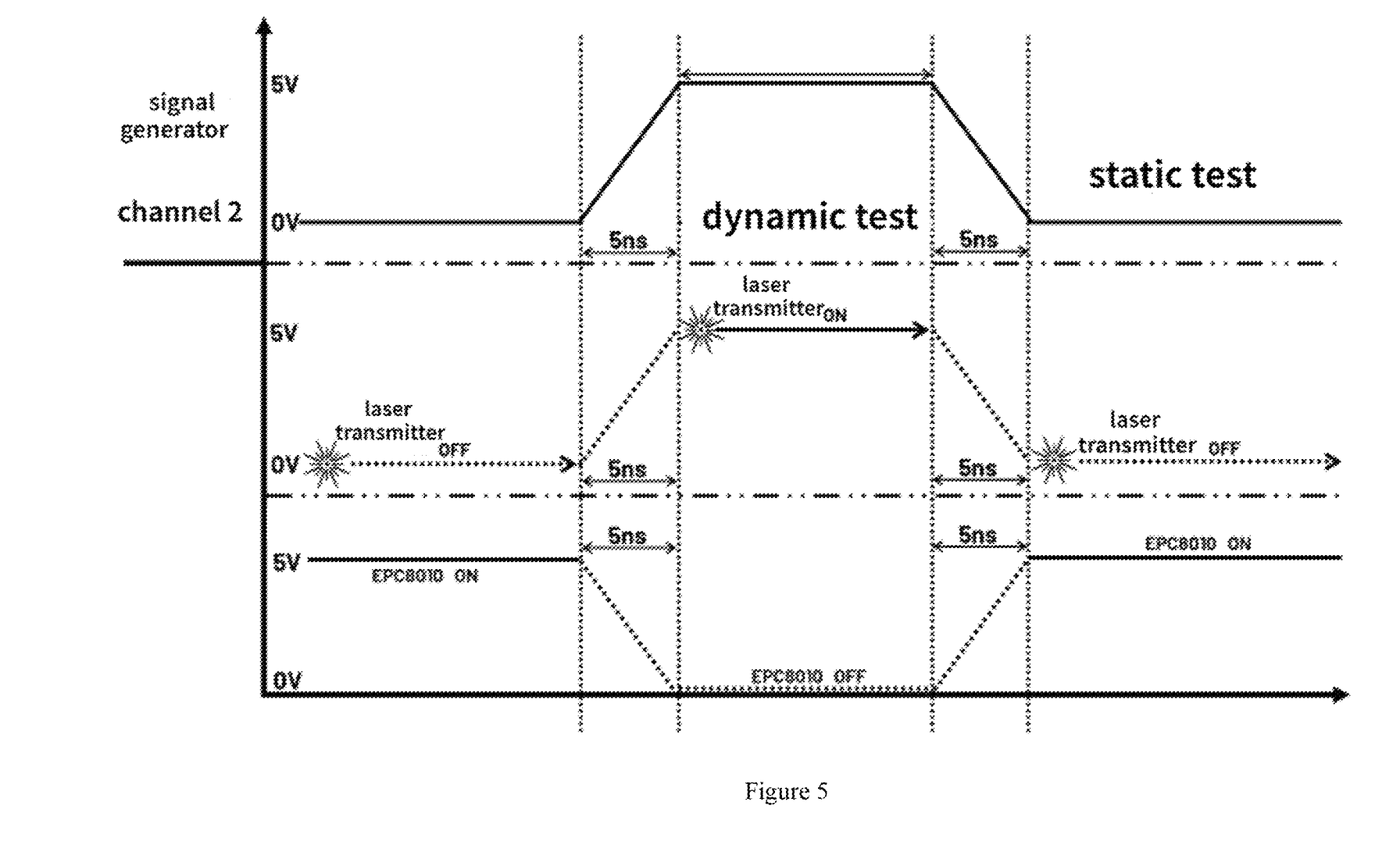
FIG. 5 is a timing diagram of the signal generation module, laser transmitter, and transistor in the present example of embodiment of the present invention.

When performing degradation characteristic test on the DUT, channel 2 of the signal generator outputs a square wave pulse signal; When the square wave pulse signal is at a low level, the static characteristic testing of the DUT is to be completed; After the static characteristic testing is completed, the square wave pulse signal reaches a high level after a 5 ns rising edge, the dynamic characteristic testing of the DUT is to be completed; After the dynamic characteristic testing is completed, the square wave pulse signal reaches a low level after a 5 ns falling edge, then the static characteristic testing of the DUT is to be completed for the second time, thus finishing the degradation characteristic test of the DUT. Shown in FIG. 5 are the timing diagram of channel 2 of the signal generator, the laser transmitter, and the transistor.

In FIG. 4, the laser drive circuit includes a voltage regulation circuit which consists of a voltage regulator XC6206 (U3) and a transistor 9013 (Q3), a current signal amplification circuit composed of an operational amplifier LMV321 (U2) and transistors 9013 (Q1, Q2), and a feedback voltage signal amplification circuit composed of an operational amplifier LMV321 (U1). The output signal of the signal generation module passes through the voltage regulation circuit and is amplified by U2, Q1, and Q2 before being input to the negative input terminal of U1, forming a current negative feedback circuit, which enables the current to be output constantly in the opposite direction. The output signal of the signal generation module is superimposed with this constant current at the negative input terminal of U1 to form the driving current of the laser.

In another embodiment, this system evaluates the property of resistance to radiation damage of semiconductor device under test when used in aerospace irradiation environments through testing of their static, dynamic and degradation characteristics.

This system evaluates the property of resistance to radiation damage of semiconductor device under test when used in aerospace irradiation environments, through on-line in-situ testing of their static, dynamic and degradation characteristics in aerospace environments.

Although preferred embodiments of the present invention have been described, once the basic creative concept is known to experts in the present area, additional changes and modifications can be made to these examples of embodiment. Therefore, the appended claims are intended to cover above-mentioned embodiment as well as all such changes and modifications as fall within the scope of the invention thereof.

Obviously, those skilled in this area can make various changes and modifications to the present invention without departing from the spirit and scope of the present invention. Thus, if these modifications and variations of the present invention are within the scope of the claims and the equivalent technologies thereof, the present invention is also intended to encompass these changes and variations.

What is claimed is:

1. A system for semiconductor device in-situ testing, the semiconductor device to be tested comprises a G terminal, a D terminal, and an S terminal, the system comprises: a static testing unit, a static testing channel, a dynamic testing unit, a dynamic testing channel, and a channel switching control unit;

the static testing unit, connected to the semiconductor device via the static testing channel, is used to output static testing signals and display the static testing data of the semiconductor device;

the dynamic testing unit, connected to the semiconductor device via the dynamic testing channel, is used to output dynamic testing signals and display the dynamic testing data of the semiconductor device;

the channel switching control unit is respectively connected with the static testing channel and the dynamic testing channel, and controls them; when the static testing channel is conducted, the dynamic testing channel is disconnected, and when the static testing channel is disconnected, the dynamic testing channel is conducted;

the static testing channel comprises a first channel, a second channel, and a third channel; the static testing unit is connected to the G terminal of the semiconductor device via the first channel, connected to the D terminal via the second channel, and the S terminal of the semiconductor device is grounded via the third channel; the first channel, the second channel, and the third channel are respectively connected to the channel switching control unit, and are controlled by the channel switching control unit to conduct or disconnect simultaneously;

the first channel, the second channel, and the third channel comprise transistors; the channel switching control unit comprises a signal generation module and an inverter circuit; the signal generation module is connected to a control terminal of the transistor via the inverter circuit; the signal generation module is used to output pulse signals of high level, low level, or square wave, and the inverter circuit inverts the pulse signals; the static testing unit is connected to the G terminal of the semiconductor device via the transistor of the first channel, and connected to the D terminal of the semiconductor device via the transistor of the second channel, and the S terminal of the semiconductor device is grounded via the transistor of the third channel.

2. The system of claim 1, wherein the inverter circuit comprises an inverter, and the signal generation module is connected to a control terminal of the transistor via the inverter.

3. The system of claim 1, wherein circuits of the first channel, the second channel, and the third channel are structurally identical.

4. The system of claim 1, wherein the dynamic testing unit comprises a power supply, a trigger module, and an oscilloscope, and the dynamic testing channel comprises a fourth channel, a fifth channel, and a sixth channel;

the trigger module is connected to the G terminal of the semiconductor device via the fourth channel, and is used to output a trigger signal; the power supply is connected to the D terminal of the semiconductor device via the fifth channel, and the S terminal of the semiconductor device under test is grounded via the sixth channel;

the G terminal, D terminal, and S terminal of the semiconductor device are also connected to the oscilloscope;

the fourth channel, the fifth channel, and the sixth channel are controlled by the channel switching control unit to conduct or disconnect simultaneously.

5. The system of claim 4, wherein the fourth channel, the fifth channel, and the sixth channel comprise components, the component consists of a series-connected photodiode and an operational amplifier;

the channel switching control unit also comprises a laser emission circuit, and the signal generation module is connected to the laser emission circuit; the laser emission circuit emits laser when receiving the pulse signal of high level and turns off when receiving the pulse signal of low level;

the trigger module is connected to the G terminal of the semiconductor device via the component of the fourth channel, the power supply is connected to the D terminal of the semiconductor device via the component of the fifth channel, and the S terminal of the semiconductor device is grounded via the component of the sixth channel;

the photodiode conducts when the laser emission circuit emits laser and cuts off when the laser emission circuit turns off.

6. The system of claim 5, wherein the laser emission circuit comprises a laser driving circuit and a laser diode, and the signal generation module is connected to the laser diode via the laser driving circuit, the laser driving circuit drives the laser diode to emit light upon receiving a high level of electricity.

7. The system of claim 4, wherein circuits of the fourth channel, the fifth channel, and the sixth channel are structurally identical.

8. The system of claim 1, wherein the static testing unit is a source measurement unit.

* * * * *